United States Patent
Huang

(10) Patent No.: US 6,768,675 B1
(45) Date of Patent: Jul. 27, 2004

(54) STACK-GATE FLASH MEMORY ARRAY

(75) Inventor: Chung-Meng Huang, Hsinchu (TW)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 10/604,691

(22) Filed: Aug. 11, 2003

(30) Foreign Application Priority Data

May 28, 2003 (TW) ........................................ 92114350 A

(51) Int. Cl.$^7$ .............................................. G11C 16/04
(52) U.S. Cl. ........................... 365/185.17; 365/185.14; 365/185.33
(58) Field of Search ........................ 365/185.17, 185.14, 365/185.15, 185.16, 185.26, 185.33

(56) References Cited

U.S. PATENT DOCUMENTS

| | | | |
|---|---|---|---|
| 5,659,505 A | * 8/1997 | Kobayashi et al. | .... 365/185.29 |
| 5,912,843 A | * 6/1999 | Jeng | ........................ 365/185.14 |
| 6,134,144 A | * 10/2000 | Lin et al. | ................ 365/185.14 |
| 2004/0047203 A1 | * 3/2004 | Lee et al. | .................... 365/202 |

* cited by examiner

Primary Examiner—Gene N. Auduong
(74) Attorney, Agent, or Firm—Tiang Chyun IP Office

(57) ABSTRACT

The present invention provides a stack-gate flash memory array. In the present invention, one bit line for a conventional memory cell had been divided two independent bit lines; two word lines have been combined together via the gate terminal of an isolated transistor. Because the bit lines are divided and the word lines will stop the leakage current via the isolated transistor, the leakage current would not affect the other memory cells. Hence, the present invention can avoid the data inaccuracy due to the leakage current resulting from the erratic bits, and thus can extend the flash memory's lifetime.

3 Claims, 3 Drawing Sheets

STACK-GATE FLASH MEMORY ARRAY

CROSS REFERENCE TO RELATED APPLICATIONS

This application claims the priority benefit of Taiwan application serial no. 92114350, filed on May 28, 2003.

BACKGROUND OF INVENTION

1. Field of the Invention

This invention generally relates to a stack-gate flash memory array, and more particularly to a stack-gate flash memory array to prevent leakage due to erratic bits.

2. Description of Related Art

Nonvolatile memory is memory storage technology that does not lose stored information when the power supply is turned off. Some examples of nonvolatile memory are ROM (Read Only Memory), PROM (Programmable Read Only Memory), EPROM (Erasable Programmable Read Only Memory), EEPROM (Electrically Erasable Programmable Read Only Memory), Mask ROM, and flash memory. Memory chips, such as DRAM (Dynamic Random Access Memory) and SRAM (Static Random Access Memory), are considered volatile memory, in that once the power supply is cut off, the stored data is lost.

However, technological advances have resulted in non-volatile memory chips such as EPROM, EEPROM. Flash memory is a type of EEPROM that can be manipulated in blocks, rather than in single bytes. Unlike, EPROM, it does not require UV light to erase the memory. It also does not require any special voltages to be erased and reprogrammed within a system. The design of the flash memory microchip is based on floating gate technology, where a charge is transferred through an oxide layer into a conductive floating gate and stored. This technology allows a section of memory cells to be erased in a single action. Through Fowler-Nordheim tunneling electrons penetrate a thin layer of dielectric material to remove an electronic charge from the floating gate, which is associated with each memory cell. Hence, flash memory equips with both nonvolatility and ability of random access, and thus is widely used.

FIG. 1 is a circuit diagram of a conventional stack-gate flash memory array. This memory array includes $2^N*2^M$ memory cells (transistors) connected by a group of bit lines BL0–BL$2^M$–1, a group of word lines WL0–WL$2^N$–1, and a common source line SL. When a flash memory cell, e.g., memory cell 102 (the transistor at the intersection of BL1 and WL1) is over erased and thus represents an erratic bit, the transistor will be turned on even without working voltage applied to the control gate and thus generates a leakage current. This leakage current affects other memory cells such as memory cells 104 and 106, that are connected to the same bit line BL1 and causes data inaccuracy stored in those cells.

To avoid data inaccuracy, the affected cells have to be erased and then reprogrammed. However, because of using the common source line SL in the conventional stack-gate flash memory array, all cells must be erased at the same time. Hence, it takes longer to do so.

Flash memory also limits how often you can erase and rewrite the same area. This number, (known as the cycling limit) depends on the specific flash memory technology, but it ranges from a hundred thousand to a million times per block. As a region of flash memory approaches its cycling limit, it begins to suffer from sporadic erase failures. With further use, these erase failures become more and more frequent. Eventually, the medium is no longer erasable and thus no longer writable, although the data already resident is still readable. Hence, the manufacturers will use firmware to count how many times a block is rewritten. When the count reaches to a predetermined number, this particular block will never be used and the size of the flash memory becomes smaller. Hence, a solution to reduce the frequency of the erasing/rewriting operation due to the leakage current is needed to extend the flash memory's lifetime.

SUMMARY OF INVENTION

An object of the present invention is to provide a stack-gate flash memory array to avoid the effect of the leakage current resulting from the erratic bits.

Another object of the present invention is to provide a stack-gate flash memory array to reduce the frequency of the erasing/rewriting operation and to extend the flash memory's lifetime.

The present invention provides a stack-gate flash memory array. In the present invention, one bit line for a conventional memory cell had been divided two independent bit lines; two word lines have been combined together via the gate terminal of an isolated transistor. Because the bit lines are divided and the word lines will stop the leakage current via the isolated transistor, the leakage current would not affect the other memory cells. Hence, the present invention can avoid the data inaccuracy due to the leakage current resulting from the erratic bits, and thus can extend the flash memory's lifetime.

The above is a brief description of some deficiencies in the prior art and advantages of the present invention. Other features, advantages and embodiments of the invention will be apparent to those skilled in the art from the following description, accompanying drawings and appended claims.

DETAILED DESCRIPTION

Figure 1:
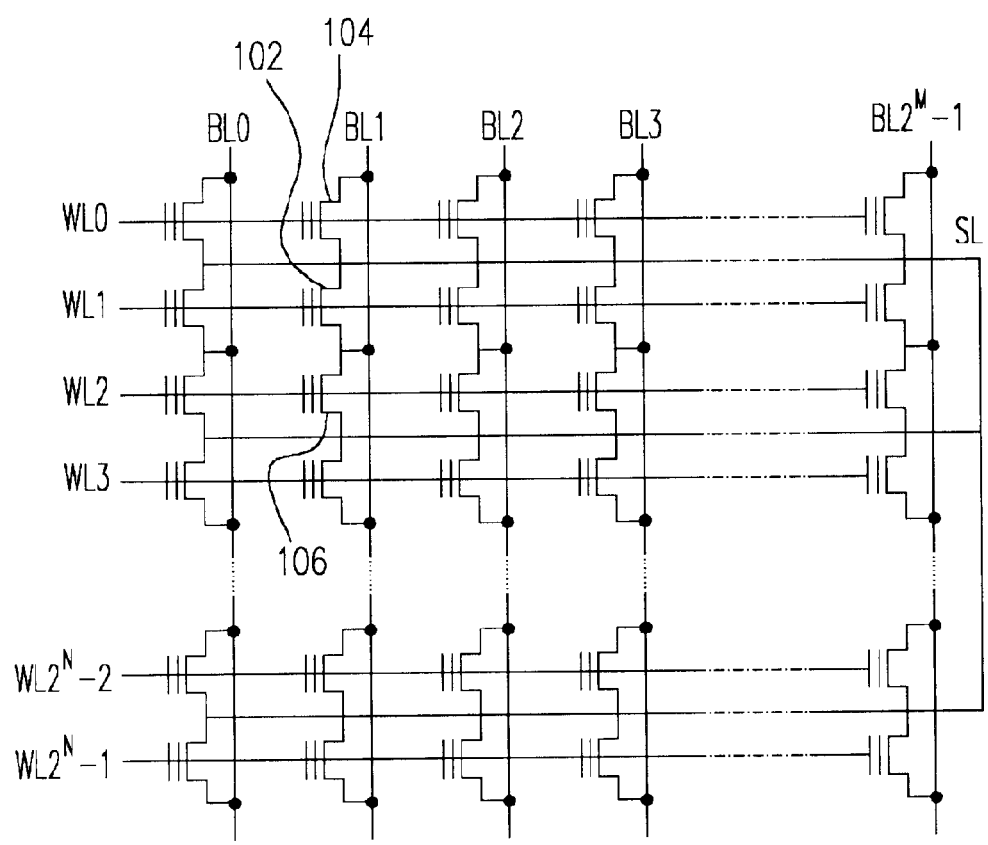
FIG. 1 is a circuit diagram of a conventional stack-gate flash memory array.
Figure 2:
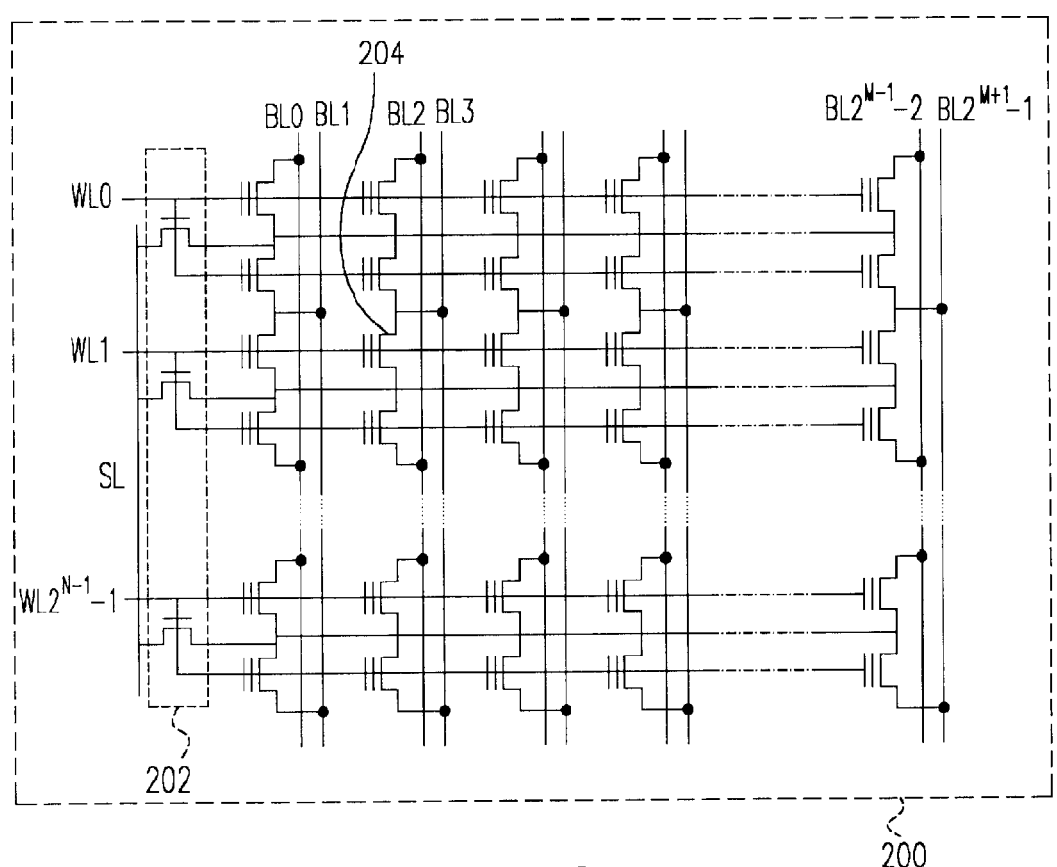
FIG. 2 is a circuit diagram of a preferred embodiment of a stack-gate flash memory array in accordance with the present invention.

FIG. 2 is a circuit diagram of a preferred embodiment of a stack-gate flash memory array in accordance with the present invention. A stack-gate flash memory array 200 includes $2^N$ (columns)*$2^M$(rows) memory cells (transistors) connected by a group of bit lines BL0–BL$2^{M+1}$–1, a group of word lines WL0–WL$2^{N-1}$–1, an isolated transistor group 202 having $2^{N-1}$ isolated transistors, and a common source line SL. For each row (e.g., row 1), the drain terminals of cells in columns 1 and 4, 5 and 8 . . . 4A+1 and 4A+4 (A=0,1,2 . . . $2^{N-2}$1.) . . . $2^N$–3 and $2^N$ are connected to a bit line (e.g., BL0); the drain terminals of cells in column 2 and 3, 6 and 7 . . . 4A+2 and 4A+3 (A=0, 1, 2 . . . $2^{N-2}$1.) . . . $2^N$–2 and $2^N$–1 are connected to another bit line (e.g., BL1).

In flash memory array 200, the gate terminals of all cells in the same column are connected together. The gate terminals of all cells in columns 1 and 2 are connected to the gate terminal of the first isolated transistor in group 202; the gate terminals of all cells in columns 3 and 4 are connected to the gate terminal of the second isolated transistor in group 202; the gate terminals of all cells in columns 2B−1 and 2B (B=1, 2 . . . $2^{N-2}$) are connected to the gate terminal of the $B^{th}$ isolated transistor in group 202.

In flash memory array 200, the source terminals of all cells in the same column are connected together. The source terminals of all cells in columns 1 and 2 are connected to the drain terminal of the first isolated transistor in group 202; the source terminals of all cells in columns 3 and 4 are connected to the drain terminal of the second isolated transistor in group 202; the source terminals of all cells in columns 2C−1 and 2C (C=1, 2 . . . $2^{N-2}$) are connected to the drain terminal of the $C^{th}$ isolated transistor in group 202. The source terminals of all isolated transistors are connected to a common source SL.

In flash memory array 200, assume a memory cell, e.g., cell 204 (at the intersection of column 3 and row 2) is an erratic bit. Because cell 204 is connected to BL3 and WL1, the leakage current may only affect the cells connected to BL3. However, it will not happen because each of those cells connected to BL3 is isolated by one isolated transistor respectively. Hence, the present invention prevents leakage current from affecting the other cells connected to the same bit line during erasing/rewriting operations.

Because the leakage current won't affect the other cells connected to the same bit line, there is no need to erase all cells when rewriting, thereby accelerate the reprogramming speed.

Figure 3:
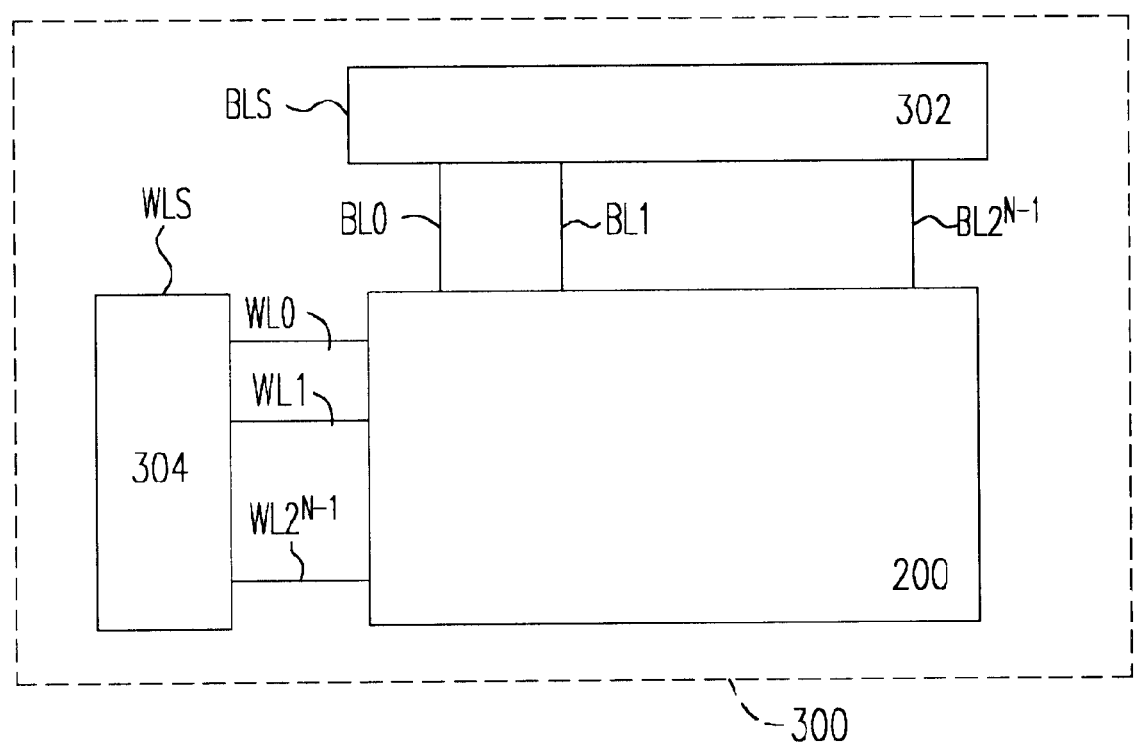
FIG. 3 is a block diagram of a preferred embodiment of a stack-gate flash memory apparatus in accordance with the present invention.

FIG. 3 is a block diagram of a preferred embodiment of a stack-gate flash memory apparatus 300 in accordance with the present invention. In stack-gate flash memory apparatus 300, for every bit line and word line, there is a corresponding bit line decoder 302 and a word line decoder 304. Bit line decoder 302, receiving a bit line signal BLS, decodes and outputs a bit line selecting signal via one of bit lines BL0 BL$2^{M+1}$−1. Word line decoder 304, receiving a word line signal WLS, decodes and outputs a word line selecting signal via one of word lines WL0 WL$2^{N-1}$−1. The stack-gate flash memory apparatus 300 selects one of the rows in the flash memory array 200 according to the bit line selecting signals and selects one isolated transistor in group 202 to perform the reading and programming operations.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A stack-gate flash memory array, comprising:

a plurality of transistors, said transistors being arranged in a plurality of rows and a plurality of columns, every two transistors in a same said row being a pair of transistors, one of the source/drain terminals of said pair of transistors being coupled each other, the other source/drain terminal of one of said pair of transistors being coupled to a first bit line, the other source/drain terminal of the other one of said pair of transistors being coupled to a second bit line; and a plurality of isolated transistors, each said isolated transistor corresponding to one of said pair transistors in a same said row, one of the drain/source terminals of each said isolated transistor being coupled to the drain/source terminal where said pair of transistors is coupled each other, the gate terminal of one of said pair transistor being coupled to a word line, the gate terminal of the other one of said pair transistor being coupled to a word line via the gate terminal of said isolated transistor.

2. A stack-gate flash memory array, comprising:

a plurality of rows of transistors, every two transistors in a same said row being a pair of transistors, one of the source/drain terminals of said pair of transistors being coupled each other, the other source/drain terminal of one of said pair of transistors being coupled to a first bit line, the other source/drain terminal of the other one of said pair of transistors being coupled to a second bit line; and a plurality of isolated transistors, said isolated transistors being coupled to a common source line, each said isolated transistor corresponding to one of said pair of transistors in a same said row, one of the drain/source terminals of each said isolated transistor being coupled to the drain/source terminal where said pair of transistors is coupled each other, the gate terminal of one of said pair of transistors being coupled to a word line, the gate terminal of the other one of said pair of transistors being coupled to a word line via the gate terminal of said isolated transistor.

3. A stack-gate flash memory apparatus, comprising:

a bit line decoder, receiving a bit line signal, for decoding and outputting a bit line selecting signal via one of a plurality of bit lines;

a word line decoder, receiving a word line signal, for decoding and outputting a word line selecting signal via one of a plurality of word lines; and a stack-gate flash memory array comprising a plurality of rows of transistors, every two neighbor transistors in a same said row being a pair of transistors, one of the source/drain terminals of said pair of transistors being coupled each other, the other source/drain terminal of one of said of pair of transistors being coupled to a first bit line, the other source/drain terminal of the other one of said pair of transistors being coupled to a second bit line; and a plurality of isolated transistors, said isolated transistors being coupled to a common source line, each said isolated transistor corresponding to one of said of pair of transistors in a same said row, one of the drain/source terminals of each said isolated transistor being coupled to the drain/source terminal where said pair of transistors is coupled each other, the gate terminal of one of said pair of transistors being coupled to a word line, the gate terminal of the other one of said pair of transistors being coupled to a word line via the gate terminal of said isolated transistor;

wherein said stack-gate flash memory apparatus selects one of said rows according to said bit line selecting signals, and selects one of said isolated transistors and one of the corresponding said pair of transistors, thereby performing the reading and programming operations.

* * * * *